United States Patent
Cheng et al.

(10) Patent No.: US 12,426,229 B2
(45) Date of Patent: Sep. 23, 2025

(54) MULTIPATTERNING GATE PROCESSING

(71) Applicant: Taiwan Semiconductor Manufacturing Company, Ltd., Hsinchu (TW)

(72) Inventors: Y. L. Cheng, Tainan (TW); Tzu-Wen Pan, Hsinchu (TW); Yu-Hsien Lin, Kaohsiung (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 436 days.

(21) Appl. No.: 18/155,928

(22) Filed: Jan. 18, 2023

(65) Prior Publication Data
US 2024/0121935 A1 Apr. 11, 2024

Related U.S. Application Data

(60) Provisional application No. 63/378,621, filed on Oct. 6, 2022.

(51) Int. Cl.
*H10B 10/00* (2023.01)
*H10D 30/00* (2025.01)
(Continued)

(52) U.S. Cl.
CPC ......... *H10B 10/125* (2023.02); *H10D 30/014* (2025.01); *H10D 30/019* (2025.01);
(Continued)

(58) Field of Classification Search
CPC .. H10B 10/125; H10D 30/014; H10D 30/019; H10D 30/501; H10D 30/509;
(Continued)

(56) References Cited

U.S. PATENT DOCUMENTS 9,660,033 B1 * 5/2017 Chen .................... H10D 62/121
9,997,519 B1 * 6/2018 Bao ..................... H10D 30/014
(Continued)

FOREIGN PATENT DOCUMENTS

| | | |
|---|---|---|
| CN | 111244038 A | 6/2020 |
| EP | 3945599 A1 | 2/2022 |
| TW | 202234524 A | 9/2022 |

*Primary Examiner* — David A Zarneke
(74) *Attorney, Agent, or Firm* — Ingrassia Fisher & Lorenz, LLP (57) ABSTRACT

Methods for fabricating semiconductor structures are provided. An exemplary method includes forming a first transistor structure and a second transistor structure over a substrate, wherein each transistor structure includes at least one nanosheet. The method further includes depositing a metal over each transistor structure and around each nanosheet; depositing a coating over the metal; depositing a mask over the coating; and patterning the mask to define a patterned mask, wherein the patterned mask lies over a masked portion of the coating and the second transistor structure, and wherein the patterned mask does not lie over an unmasked portion of the coating and the first transistor structure. The method further includes etching the unmasked portion of the coating and the metal over the first transistor structure using a dry etching process with a process pressure of from 30 to 60 (mTorr).

20 Claims, 7 Drawing Sheets

(51) Int. Cl.
*H10D 30/01* (2025.01)
*H10D 62/10* (2025.01)
*H10D 84/83* (2025.01)

(52) U.S. Cl.
CPC ......... *H10D 30/501* (2025.01); *H10D 30/509* (2025.01); *H10D 62/119* (2025.01); *H10D 62/121* (2025.01); *H10D 84/832* (2025.01); *H10D 84/834* (2025.01)

(58) Field of Classification Search
CPC .. H10D 62/119; H10D 62/121; H10D 84/832; H10D 84/834
See application file for complete search history.

(56) References Cited

U.S. PATENT DOCUMENTS

| | | | |
|---|---|---|---|
| 10,374,034 B1* | 8/2019 | Liu | H10D 30/014 |
| 10,410,933 B2* | 9/2019 | Xie | H01L 21/32139 |
| 10,600,694 B2* | 3/2020 | Mochizuki | H10D 84/0188 |
| 10,629,495 B2* | 4/2020 | Seshadri | H10D 30/0323 |
| 11,101,359 B2 | 8/2021 | Wu et al. | |
| 11,152,264 B2* | 10/2021 | Zhang | H10D 84/014 |
| 2020/0083051 A1 | 3/2020 | Wang et al. | |
| 2022/0278197 A1 | 9/2022 | Wang et al. | |
| 2023/0142732 A1* | 5/2023 | Ko | H10D 62/121 438/154 |
| 2024/0071810 A1* | 2/2024 | Ko | H10D 84/038 |
| 2025/0031441 A1* | 1/2025 | Chang | H10D 84/851 |

* cited by examiner

MULTIPATTERNING GATE PROCESSING

CROSS-REFERENCE TO RELATED APPLICATION

This application claims the benefit of U.S. Provisional Application No. 63/378,621, filed Oct. 6, 2022.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked. Such GAA transistor can be referred to as a vertically-stacked horizontal GAA (VGAA) transistor.

A static random access memory (SRAM) cell has become a popular storage unit of high speed communication, high-density storage, image processing and system-on-chip (SOC) products. Although existing SRAM cells have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Embodiments provided herein provide for forming GAA FETs, such as pull-up and pull-down transistors for use in an SRAM device. In particular, embodiments herein provide for multi-patterning gate processing that improves critical dimension uniformity of a work function adjustment layer. As a result, pull-down transistor and pull-up transistor threshold voltage may be better balanced for SRAM devices with better threshold voltage sigma. Further, methods provide for processing while avoiding high-k and fin or sheet damage.

In certain embodiments, a high power, high flow rate dry etch is performed to remove work function material from an NFET structure while the work function material remains on an adjacent PFET structure. Specifically, the work function material is deposited over both FET structures, then a coating is deposited to cover both structures. The coating is selectively masked, and then the high power, high flow rate dry etch. The described etching process maintains a sufficient distance from the PFET structure and avoids opening the coating to the PFET structure. The described etching process improves critical dimension uniformity (CDU) for the N/P boundary to achieve better SRAM Vt sigma.

Figure 1:
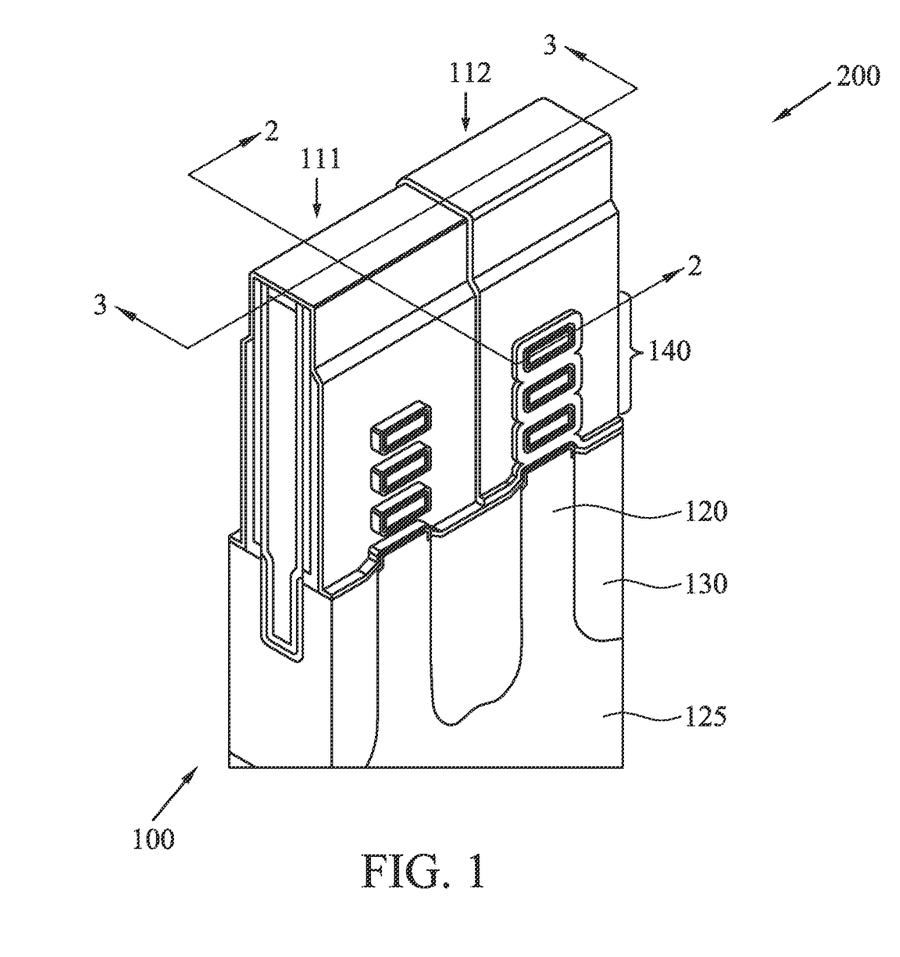
FIG. 1 is a schematic perspective view of a semiconductor structure in accordance with some embodiments.
Figure 2:
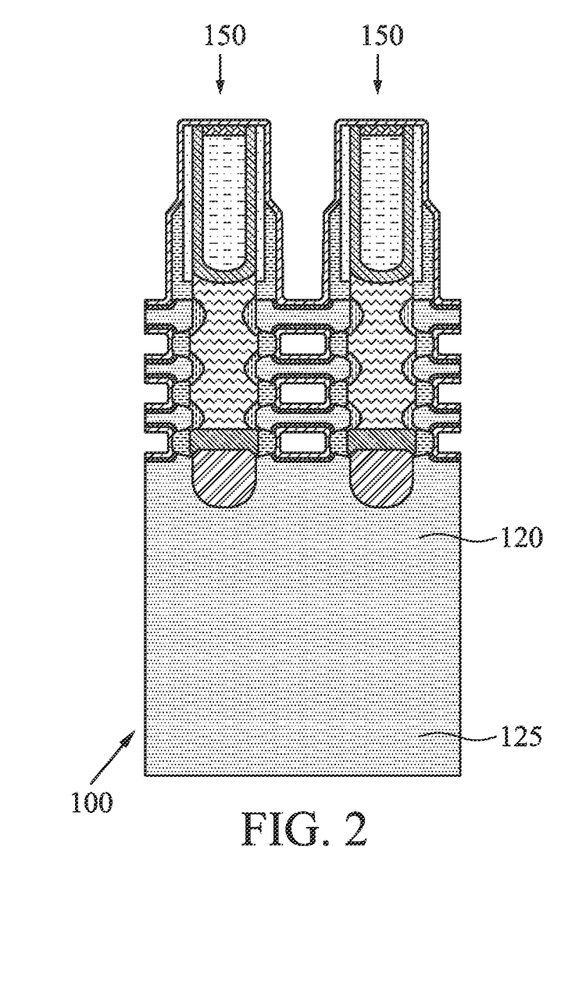
FIG. 2 is a schematic X-cut cross-section view of the semiconductor structure of FIG. 1 in accordance with some embodiments.
Figure 3:
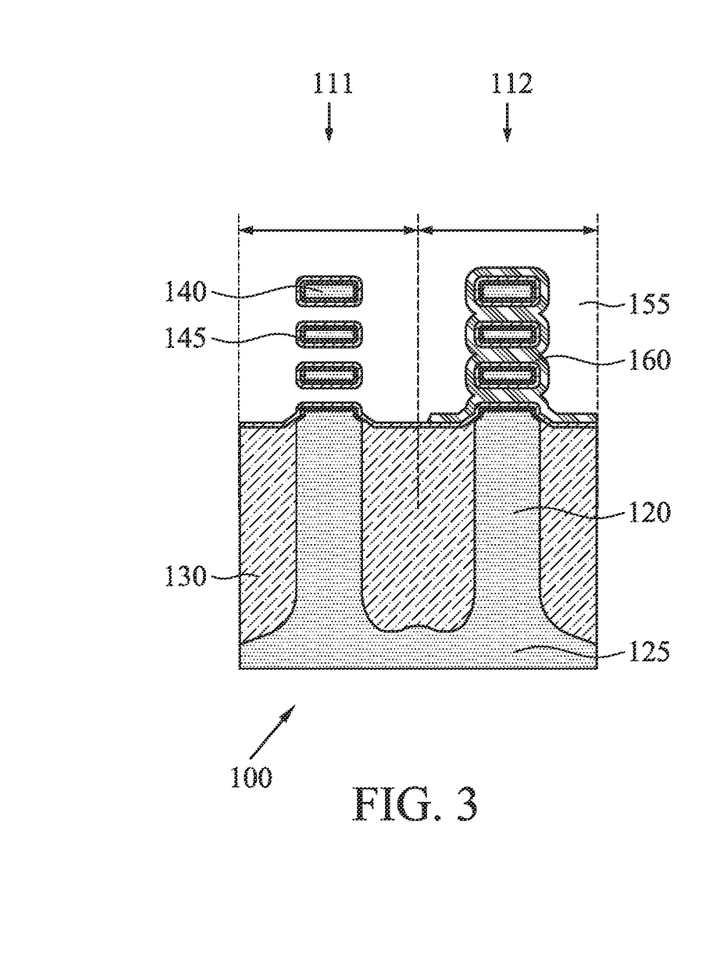
FIG. 3 is a schematic Y-cut cross-section view of the semiconductor structure of FIG. 1 in accordance with some embodiments.

Referring to FIG. 1, a schematic perspective view of a semiconductor structure 100 in accordance with some embodiments is provided. FIG. 2 is a schematic X-cut cross-section view of the semiconductor structure of FIG. 1. Specifically, the cross-section view of FIG. 2 is taken along line 2-2 in FIG. 1 and includes an adjacent gate not shown in FIG. 1. FIG. 3 is a schematic Y-cut cross-section view of the semiconductor structure of FIG. 1. Specifically, the cross-section view of FIG. 3 is taken along line 3-3 in FIG. 1. It is noted that FIG. 3 shows only the nanosheets and materials surrounding the nanosheets in the upper portion of the structure 100, and not the gate structure to simplify discussion of embodiments herein.

The structure 100 of FIGS. 1-3 includes a first gate-all-around FET (GAA-FET) 111 adjacent to a second gate-all-around FET (GAA-FET) 112. In exemplary embodiments, the GAA-FETs 111 and 112 form part of a static random access memory (SRAM) device 200. In an exemplary embodiment, first GAA-FET 111 is an n-type transistor and may be a pull-down transistor. In an exemplary embodiment, second GAA-FET 112 is a p-type transistor and may be a pull-up transistor.

Each transistor 111 and 112 is formed over a respective fin structure 120 that is etched from or formed over a substrate 125. In some embodiments, the substrate 125 includes a single crystalline semiconductor layer on at least it surface portion. The substrate 125 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 125 is made of crystalline Si.

An isolation region 130, such as a shallow trench isolation (STI) is formed over the substrate 125 and between adjacent fin structures 120.

As further shown, nanowires or nanosheets 140 constitute channel regions and are formed from semiconductor material. The nanosheets 140 are parallel and vertically arranged along the Z direction (the normal direction of the principal surface of the substrate 125). In each of the exemplary first and second GAA FETs 111 and 112, the semiconductor nanosheets 140 are formed over the respective fin structure 120 protruding from the substrate 125.

Each of the nanosheets 140 is wrapped around by a gate dielectric layer 145. An exemplary gate dielectric layer 145 is a high-k dielectric layer. In some embodiments, the gate dielectric layer includes an interfacial layer and a high-k dielectric layer. The gate dielectric layer 145 may also cover the underlying fin structures 120 and isolation region 130.

Metal gate structures 150 are formed over the nanosheets 140 and fin structures 120. The exemplary gate structures 150 may include the gate dielectric layer 145, the a gate electrode layer 155 and sidewall spacers.

Although FIGS. 1-3 shows three semiconductor nanosheets 140, the number of the semiconductor nanosheets 140 is not limited to three, and may be as small as one or more than three and may be up to fifteen (15).

In certain embodiments of the present disclosure, a work function adjustment layer or layers 160 is interposed between the gate dielectric layer 145 and the gate electrode layer 155 in the second GAA FET 112. Such work function adjustment layers 160 are not present in the first GAA FET 111.

In each of the first and second GAA FETs, a source/drain epitaxial layer is disposed over the substrate 125. The source/drain epitaxial layer is in direct contact with the nanosheets 140, and is separated by a dielectric layer as inner spacers and the gate dielectric layer 145 from the gate electrode layer. The inner spacer dielectric layer may be made of a low-k (low dielectric constant lower than the dielectric constant of $SiO_2$) material. The low-k material may include SiOC, SiOCN, organic material or porous material, or any other suitable material.

In certain embodiments, the first GAA FET 111 and the second GAA FET 112 have substantially the same structure except for the work function material 160. In certain embodiments, the dimensions of various components of the FETs 111 and 112 differ.

In exemplary embodiments, the fin structure height in the Z direction is from 50 to 70 nanometers (nm) and the fin structure width in the Y direction is from 4 to 8 nanometers (nm). In exemplary embodiments, the total metal gate height in the Z direction is from 70 to 90 nanometers (nm) and the metal gate width in the X direction is from 0 to 30 nanometers (nm).

Figure 4:
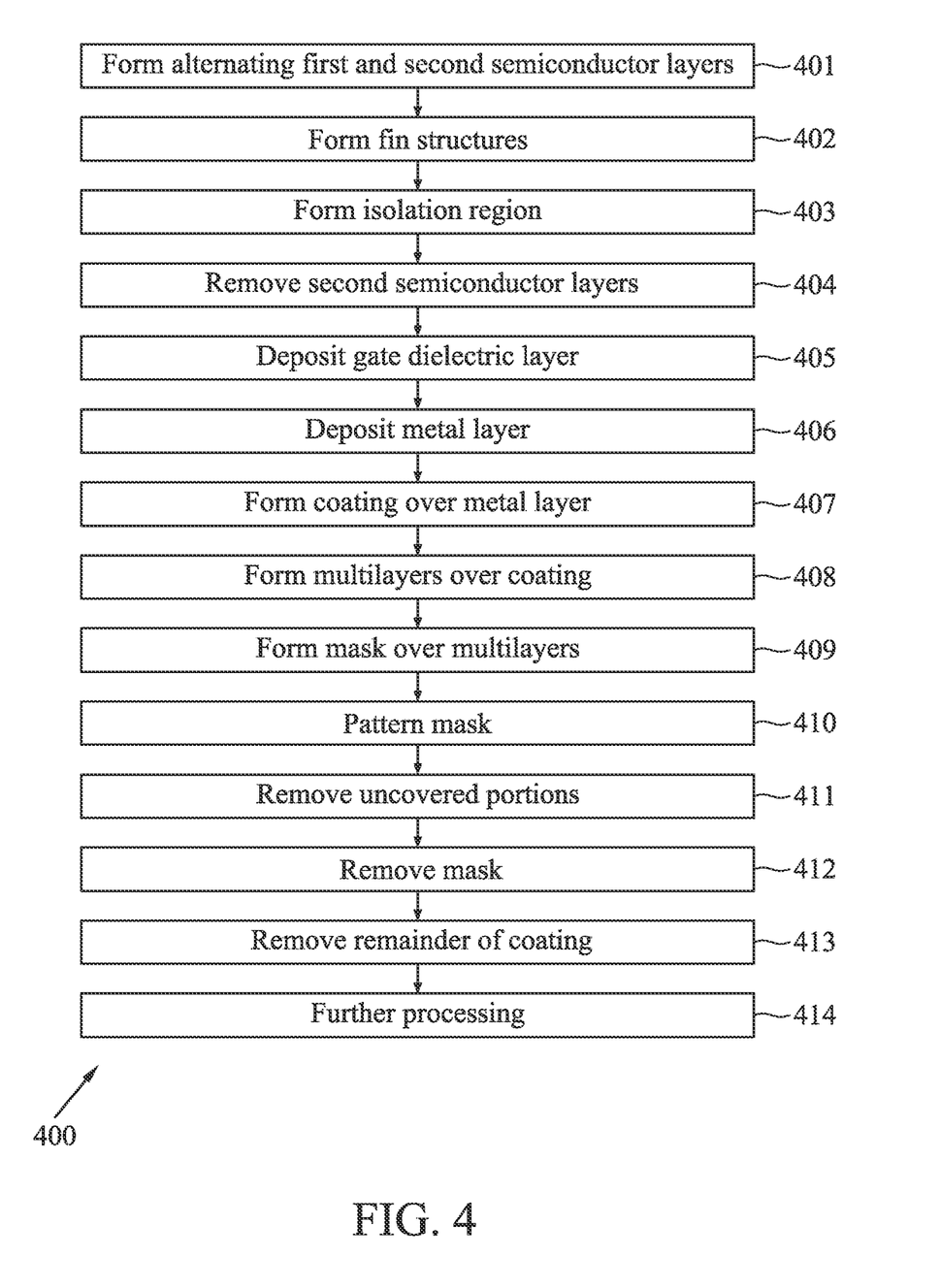
FIG. 4 is a flow chart illustrating a method in accordance with some embodiments.

FIG. 4 provides a method for fabricating the semiconductor structure 100 of FIGS. 1-3 and FIGS. 5-8 illustrate various stages of fabrication of the semiconductor structure 100 of FIGS. 1-3. FIGS. 5-8 share a perspective of FIG. 3, i.e., may be considered to be taken along line 3-3 in FIG. 1.

Cross-referencing FIGS. 4-8, an exemplary method 400 includes at action 401 forming alternating first and second layers of different semiconductor material over a substrate 125. For example, in some embodiments, first semiconductor layers of a first composition alternate with second semiconductor layers of a second composition different from the first composition.

In some embodiments, either of the semiconductor layers may include silicon. In some embodiments, either of the semiconductor layers may include other materials such as germanium (Ge), a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the first semiconductor layers may include from about 10% to about 70% Ge in molar ratio and the second semiconductor layers may include Si. In other embodiments, the first semiconductor layers may include Si and the second semiconductor layers may include from about 10% to about 70% Ge in molar ratio. In some embodiments, the first and second semiconductor layers may be undoped or substantially dopant-free (i.e., having an extrinsic dopant concentration from about 0 cm$^{-3}$ to about 1×10$^{17}$ cm$^{-3}$). Alternatively, the second semiconductor layers may be doped. For example, the first or second semiconductor layers may be doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel.

In exemplary embodiments, the thickness of first semiconductor layers may be from about 4 nm to about 10 nm. In some embodiments, the first semiconductor layers may be substantially uniform in thickness. In some embodiments, the thickness of the second semiconductor layers is from about 4 nm to about 10 nm. In some embodiments, the second semiconductor layers are substantially uniform in thickness. By way of example, growth of the layers of the stack may be performed by a molecular beam epitaxy (MBE) process, a metalorganic chemical vapor deposition (MOCVD) process, and/or other suitable epitaxial growth processes. In some embodiments, the growth of the layers of the stack may be performed using process gases comprising SiH$_4$, DCS, GeH$_4$, Si$_2$H$_6$, PH$_3$, HCl, GeH$_4$ or MMS (carbon source) and carrier gas comprising N$_2$ or H$_2$. The epitaxial growth process may be performed under process temperature in a range from about 400° C. to about 800° C. and under process pressure below about 50 torr, as example.

Processing may be later performed to remove either the first semiconductor layers or the second semiconductor layers using suitable etch techniques. The remaining semiconductor layers are referred to as nanosheets 140, such as for use in a gate-all-around (GAA) device. Such nanosheets may have a cross-sectional profile of a rectangle and may be suspended.

Method 400 further includes forming fin structures 120 over substrate 125 at action 402. The fin structures 120 may be etched from or otherwise formed over substrate 125. In exemplary embodiments, forming the fin structures 120 includes etching through the alternating semiconductor layers that are later processes into channel regions over the fin structures 120 as well as through an upper portion of the substrate 125.

Exemplary method 400 includes forming an isolation region 130, such as an STI, over the substrate 125 and between fin structures 120 at action 403.

Various conventional processes may then be performed, including for example forming sacrificial gates over the fin structures, forming sidewall spacers around the sacrificial gates, forming source/drain regions (source/drain region(s) may refer to a source or a drain, individually or collectively dependent upon the context), and removing sacrificial gates through various deposition and etching techniques.

Such processing includes, at action 404, removing the second layers of semiconductor material, thus forming the nanosheets 140 from the first layers of semiconductor material.

Method 400 may continue at action 405 with depositing a gate dielectric layer 145 around the nanosheets 140 and over the surface of the fin structure 120. In exemplary embodiments, the gate dielectric layer 145 is deposited conformally and each nanosheet 140 is wrapped in gate dielectric 145. The gate dielectric layer 145 may also be formed over a top surface of the isolation 130 or ILD.

In accordance with some embodiments, the gate dielectric layer 145 comprises silicon oxide, silicon nitride, or multilayers thereof. In some embodiments, the gate dielectric layer 145 is a high-k dielectric material, and in these embodiments, the gate dielectric layer 145 may have a k value greater than about 7.0, and may include a metal oxide or a silicate of Hf, Al, Zr, La, Mg, Ba, Ti, Pb, and combinations thereof. The formation methods of the gate dielectric layer 145 may include Molecular-Beam Deposition (MBD), ALD, PECVD, and the like.

Figure 5:
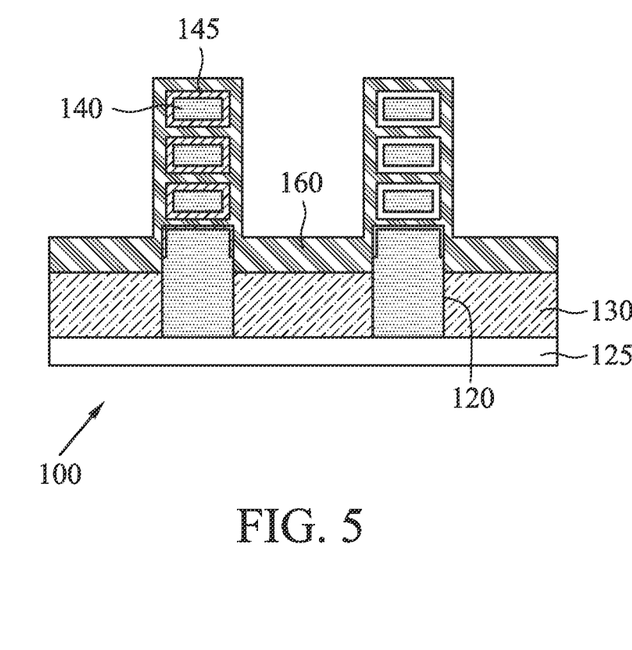
FIGS. 5-8 are schematic Y-cut cross-section views of a semiconductor structure during successive fabrication stages in accordance with some embodiments.

Method 400 further includes, at action 406, depositing a layer 160 over the structure 100 of FIG. 5. An exemplary layer 160 is a work function adjustment layer 160. An exemplary work function adjustment layer 160 for a p-channel FET may be blanket deposited and may include one or more layers of conductive material. Examples of the work function adjustment layer 160 for a p-channel FET include Ti, W, V, Nb, Nm, Mo, or similar metals. In an exemplary embodiment, the thickness of the layer 160 is from 0.5 to 20 nanometers (nm).

The work function adjustment layer 160 may be formed by chemical vapor deposition (CVD), physical vapor deposition (PVD) including sputtering, atomic layer deposition (ALD) or other suitable method.

In the illustrated embodiment of FIG. 5, work function adjustment layer 160 for a p-channel FET is deposited over both the first structure 111 and the second structure 112 and over the isolation region 130.

Figure 6:
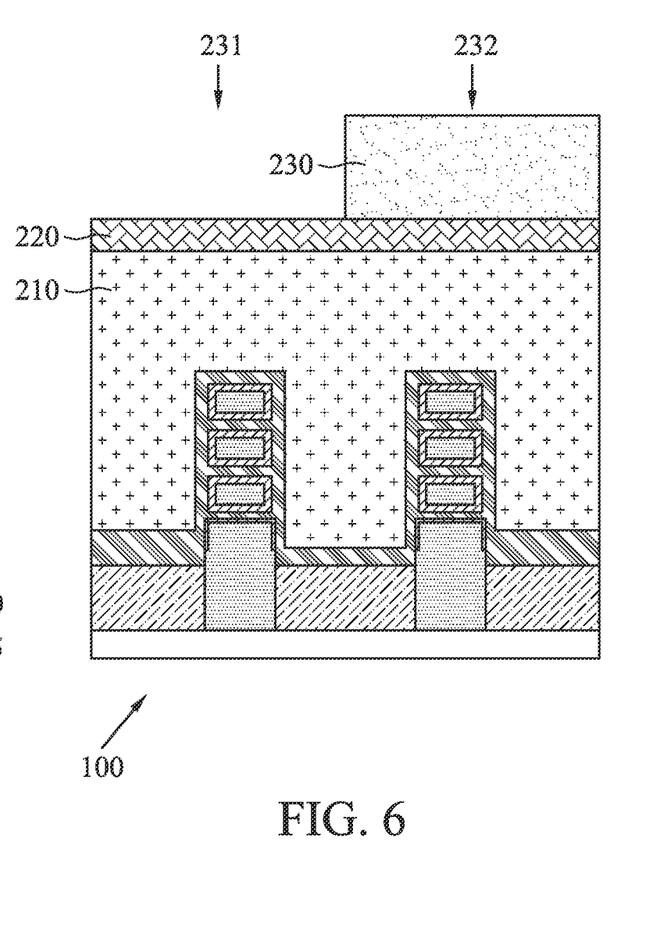

Method 400 continues at action 407 with forming a coating 210 over the structure 100, as shown in FIG. 6. An exemplary coating is a bottom anti-reflective coating (BARC). The BARC may provide for absorption of radiation incident to the substrate during photolithography processes, including exposure of an overlying photoresist layer (as described below).

In exemplary embodiments, the coating 210 is formed with a thickness of from 80 to 200 nanometers (nm).

Method 400 may further include forming reflective multilayers (ML) 220 over the coating 210 at action 408. In exemplary embodiments, the reflective multilayers 220 have a total thickness of from 3 to 7 nanometers (nm).

Method 400 may continue with forming a photosensitive mask 230 (e.g., photoresist) over the structure 100 at action 409. The photoresist 230 may be positive-tone or negative-tone resist. In an embodiment, the photoresist 230 is chemical amplified photoresist (CAR). The photoresist may include a polymer, a photoacid generator (PAG), which provides the solubility change to the developer, a solvent, and/or other suitable compositions. The photoresist may be formed by processes such as coating (e.g., spin-on coating) and soft baking. In exemplary embodiments, the photoresist 230 has a thickness of from 80 to 100 nanometers (nm).

Method 400 further includes patterning the photoresist mask at action 410. For example, the method may use various and/or varying wavelengths of radiation to expose the energy-sensitive photoresist layer. In an embodiment, the mask is irradiated using ultraviolet (UV) radiation or extreme ultraviolet (EUV) radiation. The radiation beam may additionally or alternatively include other radiation beams such as ion beam, x-ray, extreme ultraviolet, deep ultraviolet, and other proper radiation energy. In an example, the photoresist includes photoacid generator (PAG) that generates acid during the exposure process thus changing the solubility of the exposed/non-exposed material. Lithography processes include immersion lithography, photolithography, optical lithography and/or other patterning methods which may transfer a pattern onto the photosensitive layer. Patterning may further include a post-exposure bake (PEB) process. During the baking process, the photoresist layer is provided at an elevated temperature. This may allow more acid to be generated from the photo-generated acids through a chemical amplification process. Further, patterning may include developing the photoresist layer 230. The developing may form a patterned photoresist layer including a plurality of masking elements or features. During the developing process, a developing solution is applied to the photoresist layer. In one embodiment, the photoresist material that was exposed to the radiation is removed by the developing solution (developer). However, implementing a negative-tone resist is also possible. The developer or developing solution may be a positive tone developer or negative tone developer. One exemplary developer is aqueous tetramethylammonium hydroxide (TMAH).

As shown in FIG. 6, the patterned mask 230 defines an uncovered portion 231 of the underlying structure 100 that does not lie directly under the mask 230, and defines a covered portion 232 of the underlying structure 100 that lies directly under the mask 230.

Figure 7:
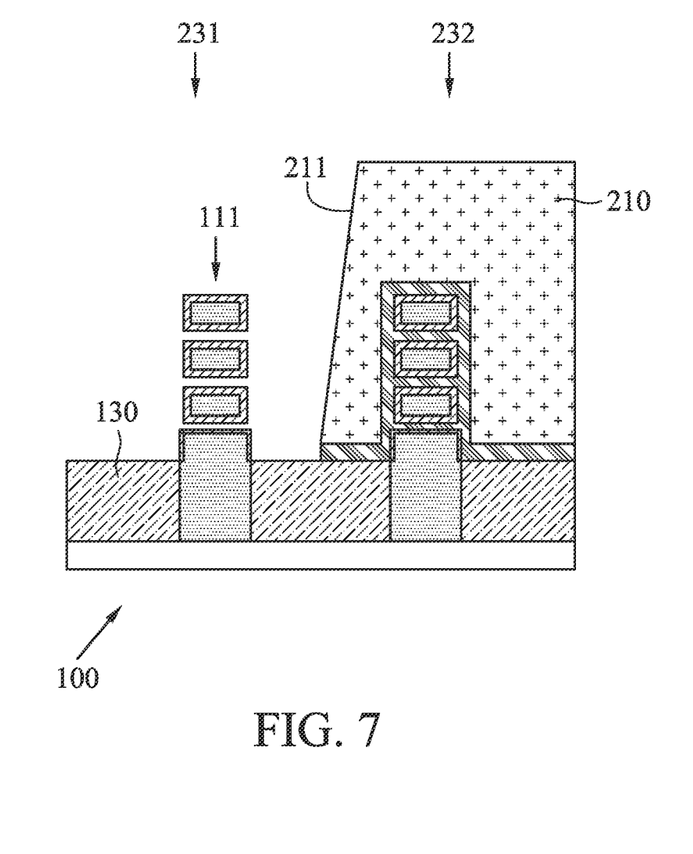

Method 400 may continue with removing uncovered portions 231 of the multilayer 220, BARC coating 210, and the work function adjustment layer 160 at action 411. As shown in FIG. 7, the work function adjustment layer 160 is removed from the FET structure 111 and from the isolation region 130 surrounding FET structure 111.

In exemplary embodiments, action 411 is performed by dry etch process, such as a dry high flow rate, high pressure etch process. In exemplary embodiments, the dry etch process performed with a high flow rate, for example, the total gas flow rate of $N_2$ and $H_2$ may be greater than 500 standard cubic centimeters per minute (sccm). In certain embodiments, the dry etch process is performed with a etch gases of $H_2$, $O_2$, and $N_2$; and the flow rate of $H_2$ is from 200 to 1500 standard cubic centimeters per minute (sccm), the flow rate of $O_2$ is from 0 to 100 standard cubic centimeters per minute (sccm), and the flow rate of $N_2$ is from 0 to 100 standard cubic centimeters per minute (sccm). Further, other gases may be used during the etch process including Ar and He; and the flow rate of Ar is from 0 to 200 standard cubic centimeters per minute (sccm), and the flow rate of He is from 0 to 200 standard cubic centimeters per minute (sccm). In an exemplary embodiment, the flow rate of $H_2$ is from 700 to 900 sccm, the flow rate of $N_2$ is from 100 to 200 sccm, the flow rate of Ar is 200 sccm, and the flow rate of $O_2$ is 0 sccm.

In exemplary embodiments, the dry etch process performed with a high pressure, for example, at a pressure of greater than 30 milliTorr (mTorr). In exemplary embodiments, the dry etch process performed with a pressure of from 30 to 60 milliTorr (mTorr). In certain embodiments, use of such a high pressure during the dry etch process results in a more vertical sidewall 211 of the etched coating 210. It is believed that the high flow/high pressure process balances the C/E plasma density to provide the more vertical sidewall profile. Thus, the process window for ensuring that the coating 210 remains covering the work function adjustment layer 160 over the GAA FET 112 is increased.

In exemplary embodiments, the dry etch process is performed at a process temperature of from 35 to 70° C.

Method 400 may continue with removing the mask 230 and multilayer 220 under the mask at action 412. In certain embodiments, the mask 230 and multilayer 220 under the mask may be removed during the etch process of action 411.

Further, method 400 may include removing the remainder of the coating 210 at action 413.

Figure 8:
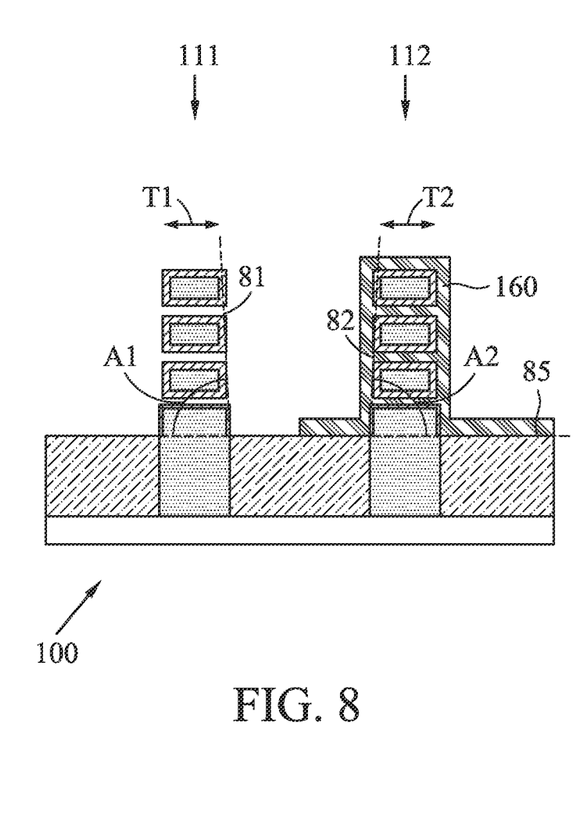

As a result, the structure 100 is formed as shown in FIG. 8. Specifically, the work function adjustment layer 160 remains over the GAA FET 112, while the work function adjustment layer 160 is not present around GAA FET 111.

As shown in FIG. 8, the GAA FET structure 111 may be formed with nanosheets 140 having a critical dimension or "channel width" T1 in the Y direction, and the GAA FET structure 112 may be formed with nanosheets 140 having a critical dimension or "channel width" T2 in the Y direction. In exemplary embodiments, the sum of T1+T2 is greater than or equal to 10 nanometers (nm) and is less than or equal to 60 nanometers (nm). Further, in exemplary embodiments, the difference of T1−T2 is greater than or equal to 0 nanometers (nm) and is less than or equal to 25 nanometers (nm). In exemplary embodiments a ratio of T1/T2 is greater than or equal to 1 and is less than or equal to 20. For example, the minimum critical dimension may be 5 nanometers (nm) and the maximum critical dimension may be 30 nanometers (nm). In exemplary embodiments, the ratio of T1/T2 is strongly correlated to Vt performance. In exemplary GAA devices, the T1/T2 ratio is from 1 to 2.5.

Further, as shown in FIG. 8, each stack of nanosheets 140 forms a respective plane defined by the aligned edges of the nanosheets 140. As shown, the plane 81 formed by the stack of nanosheets 140 in the first GAA FET 111 forms an angle A1 with a horizontal plane 85. Further, the plane 82 formed by the stack of nanosheets 140 in the second GAA FET 112 forms an angle A2 with a horizontal plane 85. In an exemplary embodiment, the sum of the angles A1+A2 is greater than 154 degrees and is less than 210 degrees. Further, the difference in angles A1−A2 is greater than 0 degrees and is less than 28 degrees. For example, a minimum angle for A2 is 77 degrees and a maximum angle for A1 is 105 degrees.

Further processing is performed at action 414. For example, a gate electrode material may be deposited over the GAA FET 111 and GAA FET 112. An exemplary gate electrode material is a conductive material including one or more layers of a metal material, such as tungsten (W), cobalt (Co), ruthenium (Ru), or iridium (Ir), or other metals. In other embodiments, the conductive material includes a silicon alloy including one of titanium silicon alloy ($Ti_xSi_y$), cobalt silicon alloy ($Co_xSi_y$), Nickle silicon alloy ($Ni_xSi_y$), tungsten silicon alloy ($W_xSi_y$), molybdenum silicon alloy ($Mo_xSi_y$), tantalum silicon alloy ($Ta_xSi_y$), or other suitable conductive materials. In one embodiment, W is used. The conductive material is formed by CVD, PVD, ALD, electroplating or other suitable methods.

Further processing may also include the formation of interlayer dielectric and/or intermetal dielectric, formation of contacts and conductive interconnects and other back end of line processing.

Figure 9:
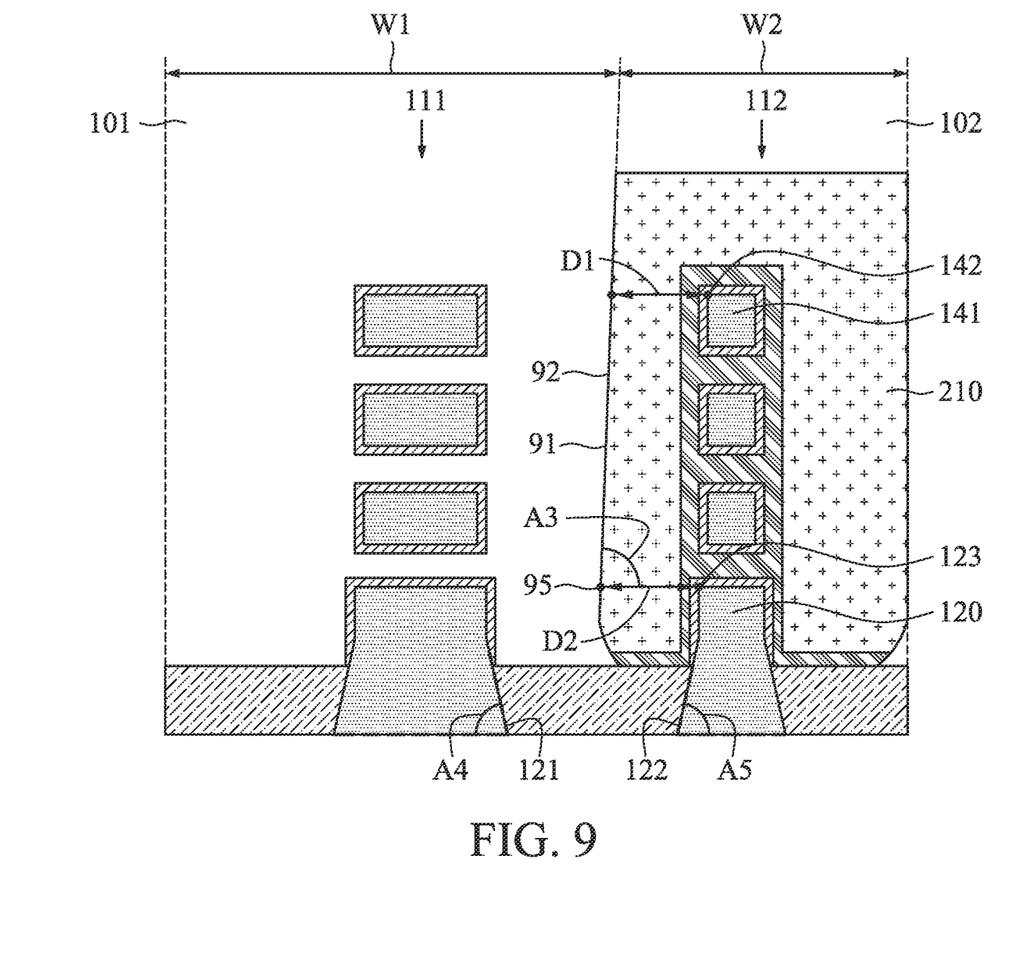
FIG. 9 is a schematic Y-cut cross-section views of a semiconductor structure shown after an etching step to etch a coating and to remove a work function metal from a selected FET area in accordance with some embodiments.

Referring now to FIG. 9, an exemplary embodiment of the structure 100 is shown after the etch to remove the work function adjustment layer 160 from the FET structure 111 and from the isolation region 130 surrounding FET structure 111.

As shown, after the etching process, the coating 210 has an etched surface 91. As shown, the etched surface 91 is distanced from the top edge 142 of an uppermost nanosheet 141 in a horizontal Y direction by a distance D1. In exemplary embodiments, D1 is from 20 to 25 nanometers (nm).

Further, a point 95 on the etched surface 91 is distanced from the top corner 123 of the fin structure 120 in a horizontal Y direction by a distance D2. In exemplary embodiments, D2 is 10 to 30 nanometers (nm).

In certain embodiments, the increased distances D1 and D2 provide protection to the work function adjustment layer 160 from being etched or damaged during the removal of the uncovered portion 231, such that the process window is enlarged.

Further, an upper portion 92 of the etched surface 91 is substantially planar and forms an angle A3 with a horizontal Y axis, such as the axis indicated by line D2. In exemplary embodiments, angle A3 is from 70 to 90 degrees. In certain embodiments, angle A3 is greater than 86 degrees.

In FIG. 9, the first GAA FET 111 is formed in a first region 101 having a width W1. Likewise, the second GAA FET 112 is formed in a second region 102 having a width W2. In exemplary embodiments, the sum of W1+W2 is greater than 15 nanometers (nm) and is less than 90 nanometers (nm). Further, in exemplary embodiments, the difference of W1−W2 is greater than 14.5 nanometers (nm) and is less than 89.5 nanometers (nm) Further, in exemplary embodiments, W1 is greater than or equal to W2 and the ratio of W1/W2 is greater than or equal to 1 and is less than or equal to 179. In exemplary embodiments, the ratio of W1/W2 impacts the Vt value. In exemplary GAA devices, the W1/W2 ratio is from 1 to 1.8.

As further shown in FIG. 9, the fin structure 120 for each GAA FET 111 and 112 may be formed with a constant or decreasing width as the height of the fin structure 120 increases. As a result, each fin structure 120 may be formed with an outer surface defining a plane. Specifically, the fin structure 120 of the GAA FET 111 may define a plane 121 that intersects a horizontal plan at an angle A4. Likewise, the fin structure 120 of the GAA FET 112 may define a plane 122 that intersects a horizontal plan at an angle A5. In an exemplary embodiment, the sum of angles A4+A5 is greater than 80 degrees and is less than 180 degrees. Further, the difference of angles A5−A4 is greater than 0 degrees and is less than 50 degrees. For example, a minimum angle A4 is 40 degrees and a maximum angle A5 is 90 degrees. In exemplary embodiments, angles A4 and A5 may impact Vt performance. In exemplary GAA devices, the difference A5−A4 is from 0 to 5 degrees.

Figure 10:
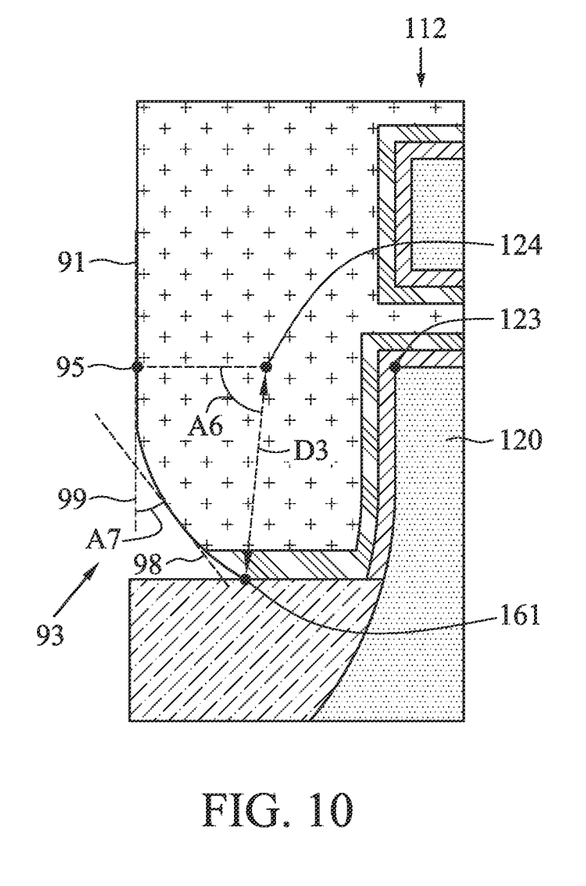
FIG. 10 is an enlarged view of the lower portion of the etched coating of the structure of FIG. 9 in accordance with some embodiments.

FIG. 10 illustrates a focused view of a lower portion 93 of the etched surface 91. As shown, the lower portion 93 of the etched surface 91 is arcuate. Work function adjustment layer 160 terminates at a bottom corner 161, which forms an interface with the isolation region 130. Further, a midpoint 124 is defined halfway between the top corner 123 of the fin structure 120 and point 95 on the etched surface 91 along a horizontal Y direction. An angle A6 is defined with a vertex at the midpoint 124, a first leg terminating at point 95, and a second leg terminating at the bottom corner 161. In exemplary embodiments, angle A6 is from 20 to 90 degrees, such as from 60 to 90 degrees.

A distance D3 is defined from the midpoint 124 to the bottom corner 161. In exemplary embodiments, the distance D3 is from 15 to 20 nanometers (nm).

The arc length from point 95 to bottom corner 161 is from 0.35 to 1.6 times the length D3, such as from 1 to 1.6 times the length D3, for example from 1.04 to 1.57 times the length D3.

As further shown, a tangent line 98 is defined by the lower portion 93 of the etched surface 91. The tangent line intersects a plane 99 defined by the upper portion 92 of the etched surface 91 at an angle A7. In exemplary embodiments, the angle A7 is from 0 to 45 degrees. In exemplary GAA devices, angle A7 is from 30 to 40 degrees, to provide for appropriate Vt sigma.

As described herein, multi-patterning gate processing provides for improved critical dimension uniformity of a work function adjustment layer 160. As a result, pull-down transistor and pull-up transistor threshold voltage may be better balanced for SRAM devices with better threshold voltage sigma. Further, methods provide for processing while avoiding high-k and fin or sheet damage.

A method for fabricating a semiconductor structure is provided. An exemplary method includes forming a first transistor structure and a second transistor structure over a substrate, wherein each transistor structure includes at least one nanosheet. The method further includes depositing a metal over each transistor structure and around each nanosheet; depositing a coating over the metal; depositing a mask over the coating; and patterning the mask to define a patterned mask, wherein the patterned mask lies over a masked portion of the coating and the second transistor structure, and wherein the patterned mask does not lie over an unmasked portion of the coating and the first transistor structure. The method further includes etching the unmasked portion of the coating and the metal over the first transistor structure using a dry etching process with a process pressure of from 30 to 60 (mTorr).

In an exemplary method, the dry etching process uses a etch gases at a flow rate of greater than 500 standard cubic centimeters per minute (sccm).

In an exemplary method, the dry etching process is performed at a process temperature of from 35 to 70° C.

In an exemplary method, the dry etching process is performed with etch gases comprising $H_2$ at a flow rate of from 200 to 1500 standard cubic centimeters per minute (sccm), $O_2$ at a flow rate of from 0 to 100 sccm, and $N_2$ at a flow rate of from 0 to 100 sccm.

In an exemplary method, the dry etching process is performed with Ar at a flow rate of from 0 to 200 sccm and He at a flow rate of from 0 to 200 sccm.

In an exemplary embodiment, the method further includes removing the patterned mask and removing the masked portion of the coating.

In an exemplary embodiment of the method, etching the unmasked portion of the coating and the metal over the first transistor structure using a dry etching process defines a remaining portion of the coating with a side surface; a portion of the side surface is located at a maximum distance from the first transistor structure; and the maximum distance is from 10 to 30 nanometers (nm).

In an exemplary embodiment of the method, etching the unmasked portion of the coating and the metal over the first transistor structure using a dry etching process defines a remaining portion of the coating with a side surface including a lower portion and an upper portion; the lower portion and the upper portion meet at a junction point; the lower portion of the side surface is arcuate; and the lower portion of the side surface extends from the junction point to an interface with an isolation material.

In an exemplary embodiment of the method, etching the unmasked portion of the coating and the metal over the first transistor structure using a dry etching process defines a remaining portion of the coating with a side surface including a lower portion and an upper portion; the lower portion and the upper portion meet at a junction point; a midpoint is defined along a horizontal line between the side surface and the first transistor structure; the lower portion of the side surface is arcuate; the lower portion of the side surface extends from the junction point to an interface with an isolation material; and an angle is defined with a vertex at the midpoint, a first leg terminating at the junction point, and a second leg terminating at the interface, wherein the angle is from 60 to 90 degrees.

In an exemplary embodiment of the method, etching the unmasked portion of the coating and the metal over the first transistor structure using a dry etching process defines a remaining portion of the coating with a side surface including a lower portion and an upper portion; the lower portion and the upper portion meet at a junction point; the lower portion is arcuate and extends from the junction point to an interface with an isolation material; and the upper portion is linear and extends along an upper line.

In another embodiment, a method is provided and includes forming a first gate-all-around (GAA) FET structure in a first transistor region including at least one nanosheet; forming a second gate-all-around (GAA) FET structure in a second transistor region adjacent to the first transistor region including at least one nanosheet; forming a work function adjustment layer over the first gate-all-around (GAA) FET structure and the second gate-all-around (GAA) FET structure; forming a coating over the work function adjustment layer; and performing an etch process to remove the coating and the work function adjustment layer from the first gate-all-around (GAA) FET structure, wherein the etch process forms the coating with an etched surface at a maximum distance of from 10 to 30 nanometers (nm) from the nanosheet in the first gate-all-around (GAA) FET structure.

In an exemplary embodiment of the method, the work function adjustment layer is titanium, tungsten, vanadium, niobium, manganese, or molybdenum.

In an exemplary embodiment of the method, the work function adjustment layer has a thickness of from 0.5 to 20 nanometers (nm).

In an exemplary embodiment of the method, the first gate-all-around (GAA) FET structure is formed in a first region having a first width, the second gate-all-around (GAA) FET structure is formed in a second region having a second width, and a sum of the first width and the second width is from 15 to 90 nanometers (nm).

In an exemplary embodiment of the method, the first gate-all-around (GAA) FET structure is formed in a first region having a first width, the second gate-all-around (GAA) FET structure is formed in a second region having a second width, the first width is greater than or equal to the second width, and the ratio of the first width to the second width is from 179:1 to 1:1.

In an exemplary embodiment of the method, the first gate-all-around (GAA) FET structure includes a stack of nanosheets that each terminate at edges defining a first plane; the first plane forms a first angle with a horizontal plane; the second gate-all-around (GAA) FET structure includes a stack of nanosheets that each terminate at edges defining a second plane; the second plane forms a second angle with the horizontal plane; a sum of the first angle and the second angle is greater than 154 degrees and is less than 210 degrees; and a difference of the first angle and the second angle is greater than 0 degrees and is less than 28 degrees.

In another embodiment, a method is provided and includes depositing a coating over a structure; depositing a mask over the coating; patterning the mask to define a patterned mask, wherein the patterned mask lies over a masked portion of the coating overlying the structure, and wherein the patterned mask does not lie over an unmasked portion of the coating; and etching the unmasked portion of the coating using a dry etching process to form an etched coating having an etched surface, wherein the etched surface includes a linear upper portion and an arcuate lower portion that meet at a junction point; the arcuate lower portion extends from the junction point to a bottom corner of the coating; and a tangent line to the arcuate lower portion intersects an axis defined by the linear upper portion at an angle of from 0 to 45 degrees.

In an exemplary embodiment of the method, the axis defined by the linear upper portion intersects a horizontal plane at an angle of greater than 86 degrees.

In an exemplary embodiment of the method, a maximum distance from the etched surface to the structure along a horizontal direction is from 10 to 30 nanometers (1 nm).

In an exemplary embodiment of the method, a minimum distance from the etched surface to the structure along the horizontal direction is defined at the bottom corner of the coating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:
   forming a first transistor structure and a second transistor structure over a substrate, wherein each transistor structure includes at least one nanosheet;
   depositing a metal over each transistor structure and around each nanosheet;
   depositing a coating over the metal;
   depositing a mask over the coating;
   patterning the mask to define a patterned mask, wherein the patterned mask lies over a masked portion of the coating and the second transistor structure, and wherein the patterned mask does not lie over an unmasked portion of the coating and the first transistor structure; and
   etching the unmasked portion of the coating and the metal over the first transistor structure using a dry etching process with a process pressure of from 30 to 60 (mTorr).

2. The method of claim 1, wherein the dry etching process uses a etch gases at a flow rate of greater than 500 standard cubic centimeters per minute (sccm).

3. The method of claim 2, wherein the dry etching process is performed at a process temperature of from 35 to 70° C.

4. The method of claim 1, wherein the dry etching process is performed with etch gases comprising $H_2$ at a flow rate of from 200 to 1500 standard cubic centimeters per minute (sccm), $O_2$ at a flow rate of from 0 to 100 sccm, and $N_2$ at a flow rate of from 0 to 100 sccm.

5. The method of claim 4, wherein the dry etching process is performed with Ar at a flow rate of from 0 to 200 sccm and He at a flow rate of from 0 to 200 sccm.

6. The method of claim 1, further comprising:
removing the patterned mask; and
removing the masked portion of the coating.

7. The method of claim 1, wherein:
etching the unmasked portion of the coating and the metal over the first transistor structure using a dry etching process defines a remaining portion of the coating with a side surface;
a portion of the side surface is located at a maximum distance from the first transistor structure; and
the maximum distance is from 10 to 30 nanometers (nm).

8. The method of claim 1, wherein:
etching the unmasked portion of the coating and the metal over the first transistor structure using a dry etching process defines a remaining portion of the coating with a side surface including a lower portion and an upper portion;
the lower portion and the upper portion meet at a junction point;
the lower portion of the side surface is arcuate; and
the lower portion of the side surface extends from the junction point to an interface with an isolation material.

9. The method of claim 1, wherein:
etching the unmasked portion of the coating and the metal over the first transistor structure using a dry etching process defines a remaining portion of the coating with a side surface including a lower portion and an upper portion;
the lower portion and the upper portion meet at a junction point;
a midpoint is defined along a horizontal line between the side surface and the first transistor structure;
the lower portion of the side surface is arcuate;
the lower portion of the side surface extends from the junction point to an interface with an isolation material; and
an angle is defined with a vertex at the midpoint, a first leg terminating at the junction point, and a second leg terminating at the interface, wherein the angle is from 60 to 90 degrees.

10. The method of claim 1, wherein:
etching the unmasked portion of the coating and the metal over the first transistor structure using a dry etching process defines a remaining portion of the coating with a side surface including a lower portion and an upper portion;
the lower portion and the upper portion meet at a junction point;
the lower portion is arcuate and extends from the junction point to an interface with an isolation material; and
the upper portion is linear and extends along an upper line.

11. A method comprising:
forming a first gate-all-around (GAA) FET structure in a first transistor region including at least one nanosheet;
forming a second gate-all-around (GAA) FET structure in a second transistor region adjacent to the first transistor region including at least one nanosheet;
forming a work function adjustment layer over the first gate-all-around (GAA) FET structure and the second gate-all-around (GAA) FET structure;
forming a coating over the work function adjustment layer; and
performing an etch process to remove the coating and the work function adjustment layer from the first gate-all-around (GAA) FET structure, wherein the etch process forms the coating with an etched surface at a maximum distance of from 10 to 30 nanometers (nm) from the at least one nanosheet in the first gate-all-around (GAA) FET structure.

12. The method of claim 11, wherein the work function adjustment layer is titanium, tungsten, vanadium, niobium, manganese, or molybdenum.

13. The method of claim 12, wherein the work function adjustment layer has a thickness of from 0.5 to 20 nanometers (nm).

14. The method of claim 11, wherein the first gate-all-around (GAA) FET structure is formed in a first region having a first width, the second gate-all-around (GAA) FET structure is formed in a second region having a second width, and a sum of the first width and the second width is from 15 to 90 nanometers (nm).

15. The method of claim 11, wherein the first gate-all-around (GAA) FET structure is formed in a first region having a first width, the second gate-all-around (GAA) FET structure is formed in a second region having a second width, the first width is greater than or equal to the second width, and a ratio of the first width to the second width is from 179:1 to 1:1.

16. The method of claim 11, wherein:
the first gate-all-around (GAA) FET structure includes a stack of nanosheets that each terminate at edges defining a first plane;
the first plane forms a first angle with a horizontal plane;
the second gate-all-around (GAA) FET structure includes a stack of nanosheets that each terminate at edges defining a second plane;
the second plane forms a second angle with the horizontal plane;
a sum of the first angle and the second angle is greater than 154 degrees and is less than 210 degrees; and
a difference of the first angle and the second angle is greater than 0 degrees and is less than 28 degrees.

17. A method comprising:
depositing a coating over a structure;
depositing a mask over the coating;
patterning the mask to define a patterned mask, wherein the patterned mask lies over a masked portion of the coating overlying the structure, and wherein the patterned mask does not lie over an unmasked portion of the coating; and
etching the unmasked portion of the coating using a dry etching process to form an etched coating having an etched surface, wherein:
the etched surface includes a linear upper portion and an arcuate lower portion that meet at a junction point; and
the arcuate lower portion extends from the junction point to a bottom corner of the coating;

a tangent line to the arcuate lower portion intersects an axis defined by the linear upper portion at an angle of from 0 to 45 degrees.

18. The method of claim 17 wherein the axis defined by the linear upper portion intersects a horizontal plane at an angle of greater than 86 degrees.

19. The method of claim 18 wherein a maximum distance from the etched surface to the structure along a horizontal direction is from 10 to 30 nanometers (nm).

20. The method of claim 19 wherein a minimum distance from the etched surface to the structure along the horizontal direction is defined at the bottom corner of the coating.

* * * * *